US006770416B2

(12) United States Patent
Figov

(10) Patent No.: US 6,770,416 B2
(45) Date of Patent: Aug. 3, 2004

(54) MULTI-PURPOSE MODULAR INFRA-RED ABLATABLE GRAPHIC ARTS TOOL

(75) Inventor: Murray Figov, Ráamana (IL)

(73) Assignee: Creo Il Ltd., Herzlia B (IL)

( * ) Notice: Subject to any disclaimer, the term of this patent is extended or adjusted under 35 U.S.C. 154(b) by 167 days.

(21) Appl. No.: 09/912,506

(22) Filed: Jul. 26, 2001

(65) Prior Publication Data

US 2003/0049562 A1 Mar. 13, 2003

(51) Int. Cl.$^7$ .................................................. G03F 7/00

(52) U.S. Cl. ............................... 430/270.1; 430/273.1; 430/302; 430/303

(58) Field of Search ........................... 430/270.1, 273.1, 430/302, 303

(56) References Cited

U.S. PATENT DOCUMENTS

| | | | | |
|---|---|---|---|---|
| 3,745,586 A | | 7/1973 | Braudy | |
| 3,787,210 A | | 1/1974 | Roberts | |
| 4,214,249 A | | 7/1980 | Kasai | |
| 4,245,003 A | | 1/1981 | Oransky | |
| 5,262,275 A | | 11/1993 | Fan | |
| 5,339,737 A | | 8/1994 | Lewis | |
| 5,378,580 A | | 1/1995 | Leenders | |
| 5,385,092 A | | 1/1995 | Lewis | |
| 5,487,338 A | | 1/1996 | Lewis | |
| 5,536,619 A | * | 7/1996 | Verburgh | 430/273.1 |
| RE35,512 E | | 5/1997 | Nowak | |
| 5,713,287 A | | 2/1998 | Gelbart | |
| 5,996,499 A | | 12/1999 | Gelbart | |
| 6,004,723 A | | 12/1999 | Figov | |
| 6,107,001 A | | 8/2000 | Lewis | |
| 6,416,932 B1 | * | 7/2002 | Ray et al. | 430/303 |

FOREIGN PATENT DOCUMENTS

| | | | | |
|---|---|---|---|---|
| GB | 1492070 | * | 11/1977 | B41M/5/12 |
| GB | 1 489 308 | | 10/1997 | |
| WO | WO 92/07716 | | 5/1992 | |
| WO | WO 94/01280 | | 1/1994 | |
| WO | WO 97/27065 | | 7/1997 | |

OTHER PUBLICATIONS

Leenders,' "Method and Material for the Production of a Dry Planographic Printing Plate" Research Disclosure, Apr. 1980.

Nechiporenko et al., "Direct Method of Producing Waterless Offset Plates by Controlled Laser Beam", Advances in Printing Science and Technology, 1980, Pentech Press. The paper was read at the 15th International Conference of Printing Research Institutes: Papers and Discsssions, Jun. 1979, Lillehammer, Norway.

* cited by examiner

*Primary Examiner*—Mark F. Huff
*Assistant Examiner*—Amanda C. Walke
(74) *Attorney, Agent, or Firm*—Edward Langer, Pat. Atty.; Shiboleth, Yisraeli, Roberts, Zisman & Co.

(57) ABSTRACT

The multi-purpose modular infra-red ablatable graphic arts tool provided comprises solutions to economy of scale for infrared ablatable Graphics Arts products by a novel modular approach of using common ingredients and by combining functions to produce multipurpose materials with synergistic advantages over the component products from which they have been derived. This is done by combining the properties of a photomask film with those of a printing plate, so that the same material can be used as a film or a plate or can function as both to produce a plate with proofing functions.

17 Claims, 3 Drawing Sheets

MULTI-PURPOSE MODULAR INFRA-RED ABLATABLE GRAPHIC ARTS TOOL

FIELD OF THE INVENTION

This invention relates to the field of infrared imaging of films and plates for use in graphic arts.

BACKGROUND OF THE INVENTION

The use of infrared laser beams in imaging processes has a long history. Braudy, in U.S. Pat. No. 3,745,586, describes a laser transfer process whereby ink coated on the back of a thin film element is selectively transferred to an adjacent material by use of laser energy. Roberts, in U.S. Pat. No. 3,787,210 describes laser blow off using a laser beam for image recording on film. Kasai et al, in Patent No. U.S. Pat. No. 4,214,249 set out the problems of laser beam recording utilizing thermal melting deformation and/or evaporation removal using a laminate of non-metal and metal layers. Oransky et al, in U.S. Pat. No. 4,245,003 describe a laser imageable film with a dried coating of graphite with resin.

Recording films have wide application in the Graphics Arts Industry. They are in use as intermediates in the preparation of various types of printing plates. For instance, they are used as ultra violet (UV) and visible light masks to image pre-sensitized offset printing plates as well as flexographic plates, gravure cylinders and printing screens. They are also used for preparing proofs for inspection before printing. In general, films are in themselves multi-purpose, in that the same material may be imaged with data in a suitable form for a particular type of printing plate and may then be used as a mask so that the plate may be selectively exposed either to UV or visible light, as part of the process of creating the printing master suitable for the particular printing process.

In the field of recording films and their applications in printing, films may now be imaged using digital information. Although silver films predominate in this market, it would be an advantage to have films that do not use conventional silver chemistry, which is a non-renewable resource and which is used with environmentally problematic processing materials. It would also be advantageous if the material could be used in daylight, without taking any special precautions. It is preferable to have the recording material imaged in such a way that no processing is necessary, but if processing must be carried out, it should be simple and fast and if a liquid is required, it should be an environmentally innocuous liquid such as water.

The use of relatively cheap laser diodes in imaging has generated potential solutions to satisfy these demands. Imaging by ablating parts of the masking layer provides the basis for a process that meets the demands of providing almost processless or processless materials and simplifies the mask preparation to a minimum number of steps. To provide adequate performance, the film must have a high $D_{max}$ (the optical transmission density of the black areas of the film) and a low $D_{min}$ (the optical transmission density in the transparent areas of the film). Such values must relate to the actinic radiation involved when the film is used as a photomask to expose a printing plate.

Although ablation recording films may be produced and have many advantages over conventional films, they have had little impact on the market despite these advantages. One reason for this is that silver-based films are relatively inexpensive. They are made in such large quantities, and as such give economy of scale. Large volumes mean that raw materials can be purchased at minimum prices and long production runs mean relatively low wastage and high productivity. While there may be a significant range of grades of these conventional films, they use common ingredients and this fact contributes to the economy of scale. Thermally ablatable films do not have advantages of economy of scale because of market limitations.

A similar situation exists with infrared ablatable waterless and conventional wet printing plates of various types that are produced for imaging. The same advantages as for thermally ablatable film may be applied to the use of ablatable printing plates, namely, daylight stability, no processing other than harmless solutions etc. The relatively low quantities manufactured compared to non-digital, conventional presensitized plates gives the latter a cost advantage due to economy of scale.

An example of a waterless thermally ablatable plate is that sold by Presstek under the name of Presstek Pearl plate. U.S. Pat. No. 5,339,737 to Lewis et al describes infrared ablatable offset plates—both for waterless printing and for wet conventional offset printing. At present, the Presstek Pearl plate is as much as four times the cost of the cheapest presensitized offset plate and suffers from the same problems of economy of scale described above.

A further example of the contrast between price of conventional printing members and ablatable members is concerned with flexo printing, where patents such as U.S. Pat. No. 5,262,275 to Fan describe flexo plates imaged by infrared laser ablation. Such plates are far more expensive than conventional flexo plates.

One working in the Graphics Arts Industry and using films and plates has to stock a wide range of products such as films and printing plates. Stocking such a range is costly.

Thus, it would be desirable to provide a graphic arts tool that would provide a solution to economy of scale for infrared ablatable graphic arts products.

SUMMARY OF THE INVENTION

Accordingly, it is a broad object of the present invention to overcome the problems of the prior art and provide solutions to economy of scale for infrared ablatable Graphics Arts products by a novel modular approach of using common ingredients and by combining functions to produce multipurpose materials with synergistic advantages over the component products from which they have been derived. This is done by combining the properties of a photomask film with those of a printing plate, so that the same material can be used as a film or a plate or can function as both to produce a plate with proofing functions.

In accordance with a preferred embodiment of the present invention there is provided a dual function printing member usable both as a printing plate and a recording film, comprising:

- a transparent substrate; and
- a coating on a top side of said substrate, said coating comprising at least one layer, wherein said coating has a measured optical density of at least 3.0 both in visible and UV light and wherein the uppermost surface of said at least one layer of said coating is scratch-resistant.

In addition, there is provided a method of producing a dual function printing member for use as both a printing plate and a recording film, comprising:

- providing a transparent base layer;
- applying a coating on top of said base layer, said coating comprising at least one layer, wherein said coating has a measured optical density of at least 3.0 both in visible and UV light and wherein the uppermost of said at least one layer of said coating is scratch-resistant; and imaging said coated base layer.

Furthermore, there is provided a graphic tool constructed from selected members of a group of modular components said group comprising:

substrates from the group of: polyester and aluminum; and ablatable coatings from the group of: carbon black, UV absorbing dye, amino resin, nitrocellulose resin and cross-linking catalysts, wherein each tool functions as at least one of a film and a plate;

and each of said tools comprises:

a substrate; and at least one ablatable coating.

Other features and advantages of the invention will become apparent from the following drawings and the description.

BRIEF DESCRIPTION OF THE DRAWINGS

For a better understanding of the invention with regard to the embodiments thereof, reference is made to the accompanying drawings, in which like numerals designate corresponding elements or sections throughout and in which.

DETAILED DESCRIPTION OF THE PREFERRED EMBODIMENT

In a first embodiment of the invention, there is provided a printing member with combined functions of a printing plate and a recording film.

Figure 1:
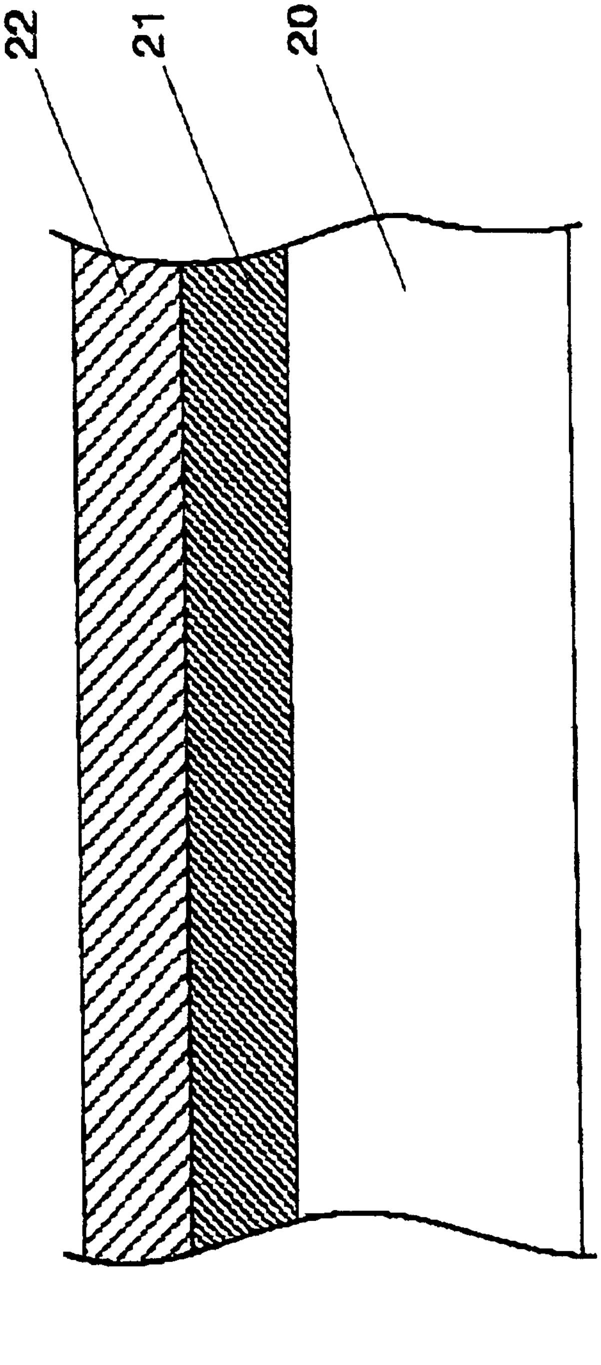
FIG. 1 is a cross-sectional representation of a member of a first embodiment of the present invention comprising coatings and substrate.

Referring now to FIG. 1, there is shown a cross-sectional representation of a member of a first embodiment of the present invention, comprising substrate film 20 that is substantially transparent to ultra violet and visible light. Film 20 is coated with polymeric layer 21, preferably based on an amino resin or a nitrocellulose resin, or a combination of the two. The thickness of this layer is less than 3 microns. Polymeric layer 21 contains carbon black, an ultra-violet absorbing dye and optionally an infrared absorbing dye.

Amino resins are generally polycondensation products of carbonyl compounds with NH— functional compounds, an example of which is

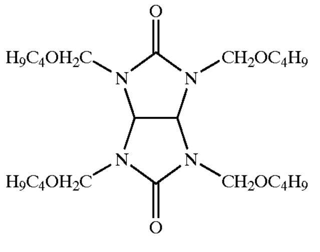

Examples of useful compounds in this group are partially methylated melamine formaldehyde resins with a high content of methylol groups. An example of such a resin is Cymel 385 (Dyno-Cytec, Botleweg 175, 3197 Rotterdam, The Netherlands), which is a proprietary material, described as having a medium degree of alkylation and a high imino functionality. The material is a complex mixture, containing different degrees of hydroxymethylation, alkylation and condensation attached around the melamine structure, as shown below:

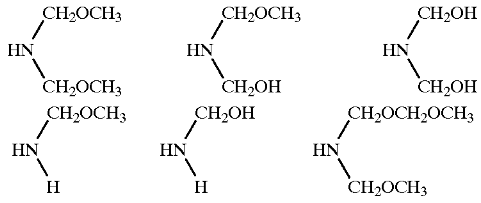

Cymel 385 is water-soluble and can undergo condensation reactions to form a strong hard film by acid catalysis—for instance using paratoluene sulfonic acid. A similar useful amino resin is sold under the name of Cymel 373 (Dyno-Cytec, Botleweg 175, 3197 Rotterdam, The Netherlands), but has a low imino content giving greater flexibility but lower curing speed.

Cymel 1170 (Dyno-Cytec, Botleweg 175, 3197 Rotterdam, The Netherlands) is a butylated glycoluril-formaldehyde amino resin used in this invention in solvent-based systems to cross-link with hydroxyl groups of nitrocellulose resin.

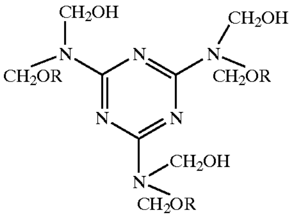

Examples of carbon blacks are Cab-O-Jet 200 and 300. These are specially treated carbon black pigments, sold as aqueous dispersions and are used in this invention in the water-based coatings. Mogul L (Cabot Corporation, Billerca, Mass., USA) and Regal 400R (Cabot Corporation, Billerca, Mass., USA) are examples of carbon blacks, which may be used in the invention both in the water-based coatings and the solvent based coatings. If used, they need to be dispersed in the system by, for instance, high-speed cavitation stirring, triple roller milling or by ball milling.

Figure 2:
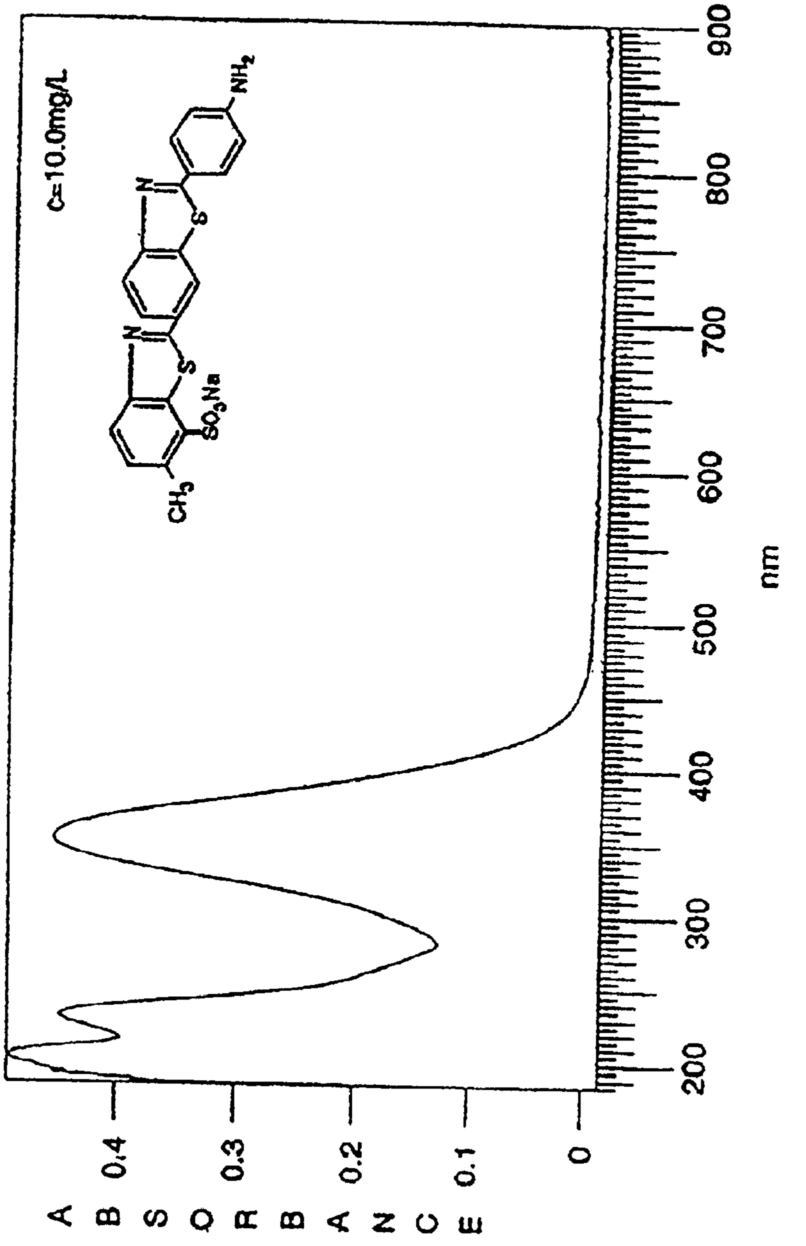
FIG. 2 shows the absorption spectrum of Primulin, by way of example.

The ultra-violet absorbing dye is usually a yellow one with an absorption peak between 320 and 400 nm—what is known as the UVA region. This region of the UV is commonly used in the processes of photopolymer plate making. Examples of water-soluble dyes suitable for this application are 4 phenylazo aniline hydrochloride, Primulin (Direct Yellow 59) and Thioflavin (Direct Yellow 7). Examples of suitable solvent soluble dyes are 4-phenyl azoaniline (solvent yellow 1) and phenyl azophenol (solvent yellow 7). FIG. 2 shows the absorption spectrum of Primulin by way of example.

Uppermost layer 22 is a protective surface comprised of a polysiloxane layer, which may contain a UV absorbing dye. The member is imaged by digital writing with an infrared source that ablates layers 21 and 22, to leave a clean transparent substrate. Thus, layer 21 is the infrared absorbent layer and layer 22 is the non-infrared absorbent, ablatable layer. Layer 22, on its own, would not be ablated using the level of energy used in the implementation of this invention. It is only ablated by transference of energy from layer 21. If necessary, the surface is wiped clean with a dry or damp rag to remove any remnants of ablated material that remains on the surface after imaging.

The member must have the following combination of properties:

The base must be transparent;

The combined coatings must give a measured optical density of not less than 3.0 both in the visible and UV (all measurements were made with a Macbeth TD 904 Densitometer);

The uppermost layer must protect the material from scratching, solvent and water attack and other handling damage;

The fully ablated areas of the plate must have an optical transmission density of less than 0.2;

The imaged member must function as a waterless offset printing plate and produce at least 10,000 good printing impressions.

With the above stated combination of properties, the Graphics Arts customer can purchase and stock such a product for multiple uses. It can be used as a recording film mask to image any conventional presensitized offset lithographic printing plates. It is particularly suitable for use with both liquid and solid flexographic members as a contact mask. Solid flexographic members have, in general, a slightly sticky surface and contact films are recommended to be matte. The member of this embodiment is shiny, permitting better film-to-plate contact, but at the same time, the silicone surface provides a release layer that prevents any sticking between the flexo surface and the recording film. Also, the film can be used with a liquid flexo plate, without the need for an intermediate protective film. Before use, the imaged film is treated with an oil or grease, which remains on the imaged areas and provides them with release properties. The resulting method improves the imaging quality by removing the intervening protective layer, which is generally used to protect the film from the liquid polymer.

The member can also be used as a computer-to-plate waterless plate. After imaging of such a plate, the plate can be used in proofing processes, which generally use film masks such as those known commercially as Chromalin (Du Pont) and Matchprint (Kodak). Thus, the proofing is made using the exact image to be printed, avoiding all risks of errors. This is a unique application engendered by the combination of film and plate functions. Such plate and film material may be imaged on computer-to-plate setters such as Trendsetters and Lotems manufactured and sold by CreoScitex. It can also be imaged in on-press offset lithographic printing machines such as the Heidelberg Quickmaster DI, wherein it would be supplied as a roll of master material.

As intimated above, the film properties have significant advantages over conventional film. The film is handleable in daylight. In the unablated areas of the coating, it has a built-in $D_{max}$, which does not vary with processing. It does not fog. It has no underexposure memory. It is close to being processless. It does not use environmentally problematic solutions, which have disposal problems as well as stability problems.

Figure 3:
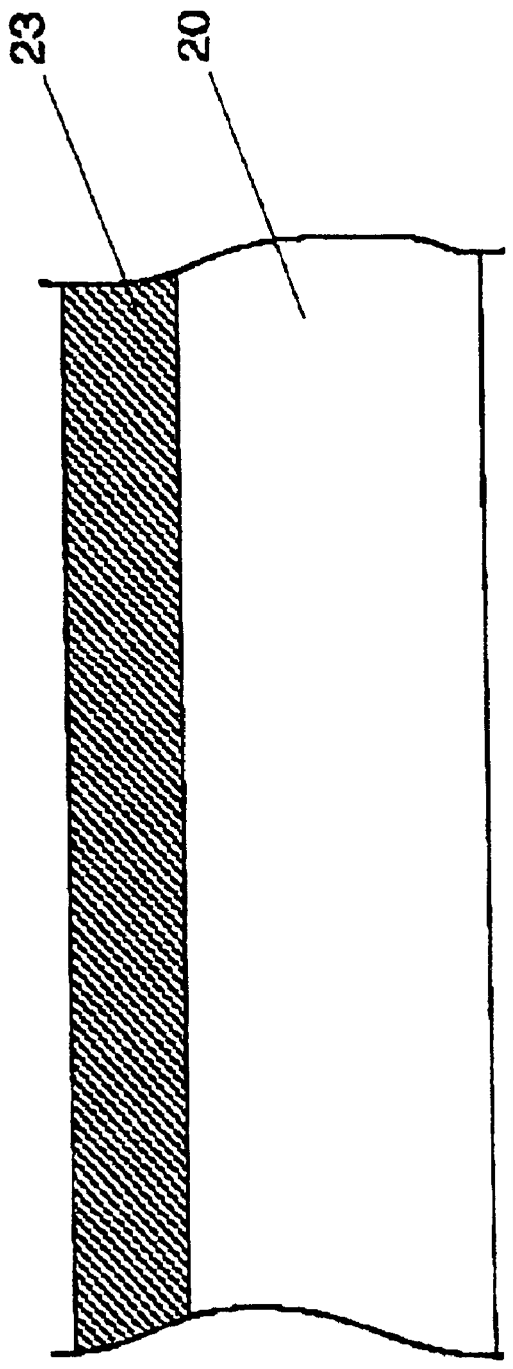
FIG. 3 is a cross-sectional representation of a member of a second embodiment of the present invention comprising coatings and substrate.

A second embodiment is depicted in FIG. 3. Substrate 20 is coated with carbon-loaded layer 23, bonded with an amino resin combined with a cross-linked hydrophilic system, preferably with a UV absorbing dye and optionally with an infrared absorbing dye. Layer 23 has a thickness between 0.5 and 3 microns. The member must have the following combination of properties:

The base must be transparent;

The coating must give a measured optical density of not less than 3.0 both in the visible and UV, as measured with a Macbeth Densitometer;

The uppermost layer must not be susceptible to scratching or other handling damage;

The fully ablated areas of the plate must have an optical transmission density of less than 0.2;

The imaged member must function as a conventional wet offset printing plate and produce at least 10,000 good printing impressions.

With the above stated combination of properties, the Graphics Arts customer can purchase and stock such a product for multiple uses. It can be used as a recording film mask to image any conventional presensitized offset lithographic printing plates. It is particularly suitable for use with solid flexographic members as a contact mask. Solid flexographic members have in general a slightly sticky surface and contact films are recommended to be matte. The member of this invention is matte and therefore suitable for use as a film with solid flexographic members.

The member can also be used as a computer-to-plate conventional wet offset plate. After imaging of such a plate, the plate can be used in proofing processes where a photomask is used, such as those known commercially as Chromalin (Du Pont) and Matchprint (Kodak). Thus, the proofing is made using the exact image to be printed, avoiding all risks of errors. This is a unique application engendered by the combination of film and plate functions. The plate and film material may be imaged on computer-to-plate setters such as Trendsetter and Lotem machines manufactured by CreoScitex. It can also be imaged in on-press systems where a conventional wet plate system is preferred over a waterless system. In its use as a plate, the ablation process of such a one-coat system as described herein removes most, if not all the ablated material by vacuum evacuation, which is usually part of the imaging system. The plate may be offered for printing without any treatment whatsoever, as any small amount of detritus is carried away on the roll-up copies that are wasted at the beginning of any printing run.

As mentioned in the previous embodiment, the film properties have significant advantages over conventional film. The film is able to be handled in daylight. The unablated areas provide a built-in $D_{max}$, which does not vary with processing. It does not fog. It has no underexposure memory. It is close to being processless. It does not use environmentally problematic solutions, which have disposal problems as well as stability problems.

Because of the multiplicity of functions of the above two embodiments, the same materials can be sold to a wider market and can have the opportunity of reduced costs due to economy of scale.

The third embodiment involves the production of a combination of films and plates which are all ablatable and have a commonality of ingredients that reduces the costs of raw materials purchase and of production, but not necessarily with multi-functionality as described in previous embodiments. The three types of members are, by way of example, polyester recording film, wet offset and dry offset plates. The common ingredients are for instance a polyester substrate, carbon black, UV absorbing dye, amino resin and cross-linking catalyst. It is preferable that the substrate and ingredients used in all of the members are identical for optimum cost benefit, but if they are of the same generic type and are from the same supplier this still provides sufficient advantage.

In addition to the above combinations coated on polyester, it is also possible to include coatings on aluminum and the coating formulation mixture itself for plateless application, as described in the U.S. Pat. Nos. 5,713,287 and 5,996,499 to Gelbart.

EXAMPLES

Example 1

Example 1 describes the first embodiment as shown in FIG. 1, where the material produced can perform the dual function of a waterless offset printing plate and a recording film that is used as a photomask.

The following mixture was made up (all quantities quoted as parts by weight):

| First Coat | |
|---|---|
| 1.98% Thioflavin solution in water | 22.1 |
| Cymel 385 | 8.73 |
| Cab-O-Jet 200 (Cabot Corporation, Billerca, Massachusetts, USA) | 43.73 |
| Bayerscript solution (Bayer, Phila., PA USA) | 21.85 |
| Tegowet KL245 (Tego Chemie Service, Hopewell VA 23860) | 1.23 |
| Cycat 4040 (Dyno-Cytec, Botleweg 175, 3197 Rotterdam, The Netherlands) | 2.36 |

The mixture was well stirred before coating with a wire wound rod onto clear 100 micron polyester and drying and curing at 140° C. for 4 minutes to give a dry film of 1.8 microns thick. Although this coating had been deposited from water solution, it was water insoluble after curing. The following second coat was mixed and then applied (all quantities quoted as parts by weight):

| Second Coat | |
|---|---|
| Alcosil part A | 10 parts |
| Alcosil part B | 5 parts |
| Alcosil gum | 5 parts |

(Alcosil products from Allcock and Sons, Ltd., Manchester, England)

The mixture was coated on top of the above coating and dried and cured at 140° C. for 4 minutes to give a dry film of 1.9 microns.

The resulting film was shiny and not easily damaged by handling. It had a $D_{max}$ of 4.5 in the visible region and 4.0 in the UV region, as measured with a Macbeth T0904 Densitometer. The blank was imaged on a Lotem Flexo at 100 lines per millimeter at 600 mJ/cm$^2$. The image was wiped with a damp cloth and then gave a $D_{min}$ of 0.08 in the visible region and 0.1 in the UV. The resulting film was then capable of acting as a mask to image printing plates, or of being used as a printing plate, by printing on a water-cooled offset litho machine using waterless printing ink.

Example 2

Example 2 describes the second embodiment as depicted in FIG. 3, where the imaged member can be used as a recording film photomask and as a conventional wet offset lithographic printing plate.

The following mixture was made up (all quantities quoted as parts by weight):

| | |
|---|---|
| 24% water solution of 99% hydrolysed polyvinyl alcohol | 12.92 |
| Kaolin | 1.12 |
| Cab-O-Jet 200 | 26.18 |
| Cymel 385 | 1.12 |
| Ethanol | 2.2 |
| Aerosol OT (BDH Laboratory Supplies, Poole, Dorset, England) | 0.04 |
| 1.98% Thioflavin solution in water | 6.46 |

The mixture was ball milled overnight and then 0.22 parts of Cycat 4040 and 1.29 parts of Titanium bis (ammoniumlactohydroxide) were added and mixed in.

The mixture was coated to a dry thickness of 1.8 microns. The resulting film was matte and not easily damaged by handling. It had a $D_{max}$ of 4.5 in both the visible region and the UV region. The blank was imaged on a Lotem Flexo at 100 lines per millimeter at 600 mJ/cm$^2$. The image was wiped with a damp cloth and then gave a $D_{min}$ of 0.05 in the visible region and 0.1 in the UV. The resulting film was then capable of acting as a mask to image printing plates. It was suitable as a mask for solid flexographic plates. The imaged blank could also be mounted directly on an offset lithographic printing machine without cleaning in any way and was then printed using standard fount and printing ink.

Example 3

The following example demonstrates the third embodiment where there is commonality between all component members.

Member 1—Recording Film Phototool.

First Coat Formulation and substrate—as in Example 1

Second Coat Formulation (all quantities quoted as parts by weight):

| | |
|---|---|
| Cymel 385 | 21.1 |
| Water | 78.01 |
| Cycat 4040 | 0.89 |

This solution was bar coated onto the first coat and was dried and cured at 140° C. for 4 minutes to a dry thickness of 0.7 microns. The resulting product was an infrared ablatable recording film of sensitivity of 600 mJ/cm$^2$, with a glossy surface that was extremely resistant to any surface scratching, delamination or general damage. It had a $D_{min}$ of 0.08 in the visible region and 0.1 in the UV. It had a $D_{max}$ of 4.5 in the visible region and 4.0 in the UV region, as measured with a Macbeth TO904.

Member 2—Wet Offset Plate

First Coat Formulation and substrate as in Example 1.

Second Coat Formulation (all quantities quoted as parts by weight):

| | |
|---|---|
| 24% water solution of 99% hydrolysed polyvinyl alcohol | 6.46 |
| Kaolin | 1.12 |
| Cymel 385 | 1.12 |
| Ethanol | 2.2 |
| Aerosol OT | 0.04 |
| 1.98% Thioflavin solution in water | 6.46 |

This formulation was bar coated and dried and cured to a thickness of 0.7 microns. The product was an infrared ablatable conventional wet offset lithographic printing plate of sensitivity 600 mJ/cm$^2$.

Member 3—Waterless Offset Plate

First Coat Formulation and substrate as in Example 1

Second Coat Formulation (all quantities quoted as parts by weight):

| | |
|---|---|
| Dehesive 410E (Wacker Chemie GmbH, Munich Germany) | 68 |
| Water | 25 |
| Cymel 373 | 11 |
| Cycat 4045 | 2.9 |
| V72 (Wacker Chemie GmbH, Munich Germany) | 13 |
| Superwetting agent (Dow Corp. Midland MI, USA) | 3 |

This was coated onto the first coat and cured to a dry coating thickness of 2.5 microns. The resulting member was a processless infrared ablatable wet conventional offset printing plate.

The above three members constitute a group of products with a commonality of ingredients. They have the same substrate, the same first coat and all contain amine resin systems in the top coat.

Taking the first three members together they all have;

identical polyester substrates identical first coat formulations two out of three have the same amine resin and catalyst. The third has an amine and catalyst from a common manufacturing source.

Further Members

The two plate material formulations can also be coated onto an aluminum or anodized aluminum substrate to give more robust plates. The mixture used in Example 2 can be sprayed onto a thermally insulative surface of plate cylinder of an offset lithographic printing press, dried and cured and then imaged by ablation. The surface will then constitute a printing plate surface and can be used in conventional wet offset printing to produce multiple impressions. At the end of the run, the surface is washed with a material such as ethyl lactate which removes the entire layer and the material is then re-coated onto the drum for use in the next printing job. This is in accordance with the Gelbart U.S. Pat. No. 5,713, 287.

Example 4

Member 1—Recording Film

The following mixture was made up (all quantities quoted as parts by weight):

| | |
|---|---|
| Methyl ethyl ketone | 76.99 |
| 4 Phenylazoaniline | 0.69 |
| cellulose nitrate | 4.66 |
| Molgul L carbon black. | 15.64 |
| Cymel 1170 | 1.79 |

This mixture was ball milled over a period of 24 hours and then 0.24 parts of Cycat 4040 added. It was then coated onto 100 micron polyester and dried and cured at 140° C. for 4 minutes to a dry thickness of 2.5 microns. This coating was easily scratched. The following mixture was made up (all quantities quoted as parts by weight):

| | |
|---|---|
| Water | 67.96 |
| Cymel 385 | 28.58 |
| Tegowet 245 | 0.88 |
| Syloid 7000 (W. R. Grace and Co., Cambridge, England) | 1.33 |

This mixture was ball milled overnight and 1.25 parts of Cycat 4040 added. The mixture was gap coated to a dry thickness of 1.5 microns and dried and cured at 140° C. for 4 minutes.

The resulting film had a matte finish, had a $D_{max}$ of 3.8 and after imaging had a $D_{min}$ of 0.18 in the visible and $D_{max}$ of 4.1 and $D_{min}$ of 0.16 in the UV. It was scratch resistant and fit to use as a photomask for preparing, by way of example, any dry flexographic printing plates.

Member 2—Waterless Plate

The above-mentioned first coat of this example was coated onto 170 micron polyester and cured and dried as above. It was then coated with the second coat of Example 3, Member 3, to give a waterless printing plate of similar performance.

Member 3—Conventional Wet Plate

The above mentioned first coat of this example was coated onto 170 micron polyester and cured and dried as above. It was then coated with the second coat of Example 3, Member 2, to give a conventional wet offset printing plate of similar performance.

Having described the invention with regard to certain specific embodiments thereof, it is to be understood that the description is not meant as a limitation, since further modifications may now suggest themselves to those skilled in the art, and it is intended to cover such modifications as fall within the scope of the appended claims.

What is claimed is:

1. A dual-function printing member usable as both a printing plate and as a recording film, comprising:

a transparent substrate; and an ablatable coating on a top side of said substrate, said coating comprising at least one layer, wherein said coating has a measured optical density of at least 3.0 both in visible and UV light and wherein the uppermost surface of said at least one layer of said coating is scratch-resistant.

2. The printing member of claim 1, wherein said coating comprises a first layer and a second layer, wherein said first layer is on top of said substrate and is a polymeric layer comprising a resin, carbon black and a UV absorbing dye and wherein said second layer is on top of said first layer, comprises amino resin and is scratch resistant.

3. The printing member of claim 2 wherein said resin in said first layer is at least one of amino and nitrocellulose resins.

4. The printing member of claim 2, wherein said first layer further comprises an infrared absorbing dye.

5. The printing member of claim 2 wherein said first layer is less than approximately 3 microns.

6. The printing member of claim 2 wherein said UV absorbing dye absorbs in the UVA region.

7. The printing member of claim 2 wherein said scratch resistant layer is comprised of polysiloxane.

8. The printing member of claim 2 wherein said scratch resistant layer further comprises a UV absorbing dye.

9. The printing member of claim 1, wherein said coating comprises a carbon-loaded layer bonded with an amino resin combined with a cross-linked hydrophilic system.

10. The printing member of claim 9, wherein said coating further comprises a UV absorbing dye.

11. The printing member of claim 9, wherein said coating further comprises an infrared absorbing dye.

12. The printing member of claim 9, wherein said coating is between approximately 0.5 and 3 microns.

13. A method of producing a dual function printing member usable as both a printing plate and as a recording film, comprising:

providing a transparent base layer; and applying an ablatable coating on top of said base layer, said coating comprising at least one layer, wherein said coating has a measured optical density of at least 3.0 both in visible and UV light and wherein the uppermost of said at least one layer of said coating is scratch resistant.

14. The method of claim 13 wherein said imaged coated base layer is used for proofing.

15. The method off claim 13, wherein said coating comprises a bottom layer and a top layer, wherein said bottom layer, on top of said base layer, is a polymeric layer comprising carbon black and a UV absorbing dye and wherein said top layer, on top of said bottom layer, is a protective layer.

16. The method of claim 15 further comprising the step of treating with at least one of an oil and a grease to provide release properties.

17. The method of claim 13, wherein said coating comprises one carbon-loaded layer bonded with an amino resin combined with a cross-linked hydrophilic system.

* * * * *